(12) United States Patent
Van Gerpen et al.

(10) Patent No.: US 9,136,467 B2
(45) Date of Patent: Sep. 15, 2015

(54) PHASE CHANGE MEMORY CELLS AND METHODS OF FORMING PHASE CHANGE MEMORY CELLS

(75) Inventors: Damon E. Van Gerpen, Kuna, ID (US); Roberto Bez, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/460,302

(22) Filed: Apr. 30, 2012

(65) Prior Publication Data

US 2013/0285002 A1 Oct. 31, 2013

(51) Int. Cl.
*H01L 47/00* (2006.01)
*H01L 45/00* (2006.01)
*H01L 27/24* (2006.01)

(52) U.S. Cl.
CPC ............ *H01L 45/06* (2013.01); *H01L 27/2436* (2013.01); *H01L 27/2463* (2013.01); *H01L 45/1233* (2013.01); *H01L 45/141* (2013.01); *H01L 45/144* (2013.01); *H01L 45/1683* (2013.01)

(58) Field of Classification Search
CPC . H01L 45/122; H01L 45/1233; H01L 45/124; H01L 45/141; H01L 45/144; H01L 45/1683
USPC ....... 257/4, E47.5, E45.1, E47.005, E45.001, 257/E45.002, E45.003; 438/382, 900
See application file for complete search history.

(56) References Cited

U.S. PATENT DOCUMENTS

| | | | |
|---|---|---|---|
| 4,752,118 A | 6/1988 | Johnson | |
| 4,849,247 A | 7/1989 | Scanlon et al. | |
| 4,987,099 A | 1/1991 | Flanner | |
| 5,055,423 A | 10/1991 | Smith et al. | |
| 5,166,758 A | 11/1992 | Ovshinsky et al. | |
| 5,895,963 A | 4/1999 | Yamasaki | |

(Continued)

FOREIGN PATENT DOCUMENTS

WO WO 2010/073904 7/2010
WO PCT/US2012/063962 3/2013

(Continued)

OTHER PUBLICATIONS

U.S. Appl. No. 13/070,169, filed Mar. 23, 2011, Bresolin et al.

(Continued)

*Primary Examiner* — Thao X Le
*Assistant Examiner* — Gardner W Swan
(74) *Attorney, Agent, or Firm* — Wells St. John, P.S.

(57) ABSTRACT

A phase change memory cell has first and second electrodes having phase change material there-between. The phase change memory cell is devoid of heater material as part of either of the first and second electrodes and being devoid of heater material between either of the first and second electrodes and the phase change material. A method of forming a memory cell having first and second electrodes having phase change material there-between includes lining elevationally inner sidewalls of an opening with conductive material to comprise the first electrode of the memory cell. Elevationally outer sidewalls of the opening are lined with dielectric material. Phase change material is formed in the opening laterally inward of and electrically coupled to the conductive material in the opening. Conductive second electrode material is formed that is electrically coupled to the phase change material. Other implementations are disclosed.

11 Claims, 5 Drawing Sheets

(56) References Cited

U.S. PATENT DOCUMENTS

| | | | |
|---|---|---|---|
| 5,912,839 A | 6/1999 | Ovshinsky et al. | |
| 6,143,670 A | 11/2000 | Cheng et al. | |
| 6,611,453 B2 | 8/2003 | Ning | |
| 6,613,604 B2* | 9/2003 | Maimon et al. | 438/95 |
| 6,661,330 B1 | 12/2003 | Young | |
| 6,664,182 B2 | 12/2003 | Jeng | |
| 6,692,898 B2 | 2/2004 | Ning | |
| 6,700,211 B2 | 3/2004 | Gonzalez et al. | |
| 6,764,894 B2* | 7/2004 | Lowrey | 438/238 |
| 6,815,704 B1* | 11/2004 | Chen | 257/2 |
| 7,148,140 B2 | 12/2006 | Leavy et al. | |
| 7,169,624 B2 | 1/2007 | Hsu | |
| 7,332,401 B2 | 2/2008 | Moore et al. | |
| 7,422,926 B2 | 9/2008 | Pellizzer et al. | |
| 7,453,111 B2 | 11/2008 | Ryoo et al. | |
| 7,619,933 B2 | 11/2009 | Sarin | |
| 7,638,787 B2 | 12/2009 | An et al. | |
| 7,646,631 B2 | 1/2010 | Lung | |
| 7,719,039 B2 | 5/2010 | Muralidhar et al. | |
| 7,772,680 B2 | 8/2010 | Manning | |
| 7,773,413 B2 | 8/2010 | Shalvi | |
| 7,785,978 B2 | 8/2010 | Smythe | |
| 7,800,092 B2 | 9/2010 | Liu et al. | |
| 7,803,655 B2* | 9/2010 | Johnson et al. | 438/95 |
| 7,838,341 B2 | 11/2010 | Dennison | |
| 7,867,832 B2 | 1/2011 | Yang et al. | |
| 7,888,711 B2 | 2/2011 | Cheung et al. | |
| 7,915,602 B2 | 3/2011 | Sato | |
| 7,919,766 B2 | 4/2011 | Lung | |
| 7,935,553 B2 | 5/2011 | Scheurlein et al. | |
| 7,974,115 B2 | 7/2011 | Jeong et al. | |
| 8,013,319 B2 | 9/2011 | Chang | |
| 8,110,822 B2 | 2/2012 | Chen | |
| 8,614,433 B2 | 12/2013 | Lee et al. | |
| 2002/0173101 A1 | 11/2002 | Shau | |
| 2002/0177292 A1 | 11/2002 | Dennison | |
| 2004/0178425 A1 | 9/2004 | Kato | |
| 2005/0006681 A1 | 1/2005 | Okuno | |
| 2005/0110983 A1* | 5/2005 | Jeong et al. | 356/148 |
| 2006/0073652 A1 | 4/2006 | Pellizzer et al. | |
| 2006/0076548 A1 | 4/2006 | Park et al. | |
| 2006/0113520 A1 | 6/2006 | Yamamoto et al. | |
| 2006/0157682 A1 | 7/2006 | Scheurlein | |
| 2006/0186440 A1* | 8/2006 | Wang et al. | 257/246 |
| 2006/0284279 A1 | 12/2006 | Lung et al. | |
| 2006/0286709 A1 | 12/2006 | Lung et al. | |
| 2007/0012905 A1 | 1/2007 | Huang | |
| 2007/0029676 A1 | 2/2007 | Takaura et al. | |
| 2007/0054486 A1 | 3/2007 | Yang | |
| 2007/0075347 A1 | 4/2007 | Lai et al. | |
| 2007/0075359 A1 | 4/2007 | Yoon et al. | |
| 2007/0108431 A1 | 5/2007 | Chen et al. | |
| 2007/0158698 A1 | 7/2007 | Dennison et al. | |
| 2007/0224681 A1 | 9/2007 | Chen et al. | |
| 2007/0235708 A1 | 10/2007 | Elmgreen et al. | |
| 2007/0279974 A1 | 12/2007 | Dennison et al. | |
| 2008/0043520 A1 | 2/2008 | Chen | |
| 2008/0054470 A1 | 3/2008 | Amano et al. | |
| 2008/0067485 A1 | 3/2008 | Besana et al. | |
| 2008/0067486 A1* | 3/2008 | Karpov et al. | 257/3 |
| 2008/0093703 A1 | 4/2008 | Yang et al. | |
| 2008/0105862 A1 | 5/2008 | Lung et al. | |
| 2008/0128677 A1 | 6/2008 | Park et al. | |
| 2008/0137400 A1 | 6/2008 | Chen et al. | |
| 2008/0138929 A1 | 6/2008 | Lung | |
| 2008/0157053 A1* | 7/2008 | Lai et al. | 257/4 |
| 2008/0197394 A1 | 8/2008 | Caspary et al. | |
| 2009/0008621 A1 | 1/2009 | Lin et al. | |
| 2009/0017577 A1 | 1/2009 | An et al. | |
| 2009/0032794 A1 | 2/2009 | Hsiao | |
| 2009/0039333 A1 | 2/2009 | Chang et al. | |
| 2009/0072213 A1 | 3/2009 | Elmgreen et al. | |
| 2009/0072341 A1 | 3/2009 | Liu et al. | |
| 2009/0091971 A1 | 4/2009 | Dennison et al. | |
| 2009/0101883 A1 | 4/2009 | Lai et al. | |
| 2009/0108247 A1 | 4/2009 | Takaura et al. | |
| 2009/0115020 A1 | 5/2009 | Yang et al. | |
| 2009/0127538 A1 | 5/2009 | Ryoo et al. | |
| 2009/0147564 A1 | 6/2009 | Lung | |
| 2009/0194757 A1* | 8/2009 | Lam et al. | 438/95 |
| 2009/0194758 A1 | 8/2009 | Chen | |
| 2009/0230505 A1 | 9/2009 | Dennison | |
| 2009/0298222 A1 | 12/2009 | Lowrey et al. | |
| 2009/0302300 A1 | 12/2009 | Chang et al. | |
| 2009/0321706 A1 | 12/2009 | Happ et al. | |
| 2010/0001248 A1 | 1/2010 | Wouters et al. | |
| 2010/0001253 A1 | 1/2010 | Arnold et al. | |
| 2010/0019221 A1 | 1/2010 | Lung et al. | |
| 2010/0054029 A1 | 3/2010 | Happ et al. | |
| 2010/0055830 A1 | 3/2010 | Chen et al. | |
| 2010/0065530 A1 | 3/2010 | Walker et al. | |
| 2010/0072447 A1 | 3/2010 | Lung | |
| 2010/0072453 A1* | 3/2010 | Jeong et al. | 257/5 |
| 2010/0107403 A1 | 5/2010 | Aubel et al. | |
| 2010/0151652 A1 | 6/2010 | Lung et al. | |
| 2010/0163830 A1 | 7/2010 | Chang et al. | |
| 2010/0163833 A1 | 7/2010 | Borghi et al. | |
| 2010/0165719 A1 | 7/2010 | Pellizzer | |
| 2010/0176368 A1 | 7/2010 | Ko et al. | |
| 2010/0176911 A1 | 7/2010 | Park et al. | |
| 2010/0207168 A1 | 8/2010 | Sills et al. | |
| 2010/0213431 A1 | 8/2010 | Yeh et al. | |
| 2010/0221874 A1 | 9/2010 | Kuo et al. | |
| 2010/0270529 A1 | 10/2010 | Lung | |
| 2010/0301303 A1 | 12/2010 | Wang et al. | |
| 2010/0301304 A1 | 12/2010 | Chen et al. | |
| 2010/0301417 A1 | 12/2010 | Cheng et al. | |
| 2010/0308296 A1 | 12/2010 | Pirovano et al. | |
| 2010/0323490 A1 | 12/2010 | Sreenivasan et al. | |
| 2010/0327251 A1 | 12/2010 | Park | |
| 2011/0001114 A1 | 1/2011 | Zanderighi et al. | |
| 2011/0031461 A1 | 2/2011 | Kang et al. | |
| 2011/0074538 A1 | 3/2011 | Wu et al. | |
| 2011/0092041 A1 | 4/2011 | Lai et al. | |
| 2011/0155984 A1 | 6/2011 | Redaelli et al. | |
| 2011/0193042 A1 | 8/2011 | Maxwell | |
| 2011/0193049 A1 | 8/2011 | Iwakaji et al. | |
| 2011/0215436 A1 | 9/2011 | Tang et al. | |
| 2011/0284815 A1* | 11/2011 | Kim et al. | 257/4 |
| 2011/0300685 A1 | 12/2011 | Horii et al. | |
| 2011/0312178 A1 | 12/2011 | Watanabe et al. | |
| 2013/0277796 A1 | 10/2013 | Yang et al. | |

FOREIGN PATENT DOCUMENTS

| | | |
|---|---|---|
| WO | WO 2013/039496 | 3/2013 |
| WO | PCT/US2012/063962 | 5/2014 |
| WO | PCT/US2014/011250 | 5/2014 |

OTHER PUBLICATIONS

U.S. Appl. No. 13/276,523, filed Oct. 19, 2011, Redaelli et al.
U.S. Appl. No. 13/298,722, filed Nov. 17, 2011, Redaelli et al.
U.S. Appl. No. 13/298,840, filed Nov. 17, 2011, Tang et al.
U.S. Appl. No. 13/298,962, filed Nov. 17, 2011, Pellizzer et al.
U.S. Appl. No. 13/460,356, filed Apr. 30, 2012, Van Gerpen.
Bez; Chalcogenide PCM: a Memory Technology for Next Decade; IEEE, 2009, pp. 5.1.1 .5.1.4.
Czubatyj et al., "Current Reduction in Ovonic Memory Devices", downloaded from www.epcos.org/library/papers/pdC2006/pdf.../Czubatyj.pdf; prior to Nov. 17, 2011.
Fazio, "Future Directions of Non-Volatile Memory in Compute Applications", IEEE, 2009, pp. 27.7.1-7 27,7.4.
Happ et al., "Novel One-Mask Self-Heating Pillar Phase Change Memory", IEEE, 2006 Symposium on 5 VLSI Technology Digest of Technical Papers; 2 pp.
Lee et al.; Programming Disturbance and Cell Scaling in Phase Change Memory: For up to 16nm based 4F2 Cell; IEEE, 2010 Symposium on VLSI Technology Digest ofTechnical Papers, pp. 199-200.
Raoux et al., Effect of Ion Implantation on Crystallization Properties of Phase Change Materials, presented at E\PCOS201 0 Conference, Sep. 6-7, 2010, Politecnico di Milano, Milan, Italy.

(56) References Cited

OTHER PUBLICATIONS

Russo et al.; Modeling of Programming and Read Performance in Phase-Change Memories—Part II: Program Disturb and Mixed-Scaling Approach,. IEEE Transactions on Electron Devices, vol. 55(2), Feb. 2008, pp. 5.15-5.22.
Servalli; A 45nm Generation Phase Change Memory Technology; IEEE 2009; pp. IEDM09-113-IEDM09-116.
Villa et al.; A 45nm 1Gb 1.8V Phase-Change Memory; 2010 IEEE International Solid-State Circuits Conference; Feb. 9, 2010; pp. 270-271.
U.S. Appl. No. 13/666,744, filed Nov. 1, 2012, Goswami.
U.S. Appl. No. 13/761,570, filed Feb. 7, 2013, Liu et al.
U.S. Appl. No. 14/295,770, filed Jun. 4, 2014, Pellizzer.
U.S. Appl. No. 14/242,588, filed Apr. 1, 2014, Lindenberg.
U.S. Appl. No. 14/293,577, filed Jun. 2, 2014, Pellizzer et al.

* cited by examiner

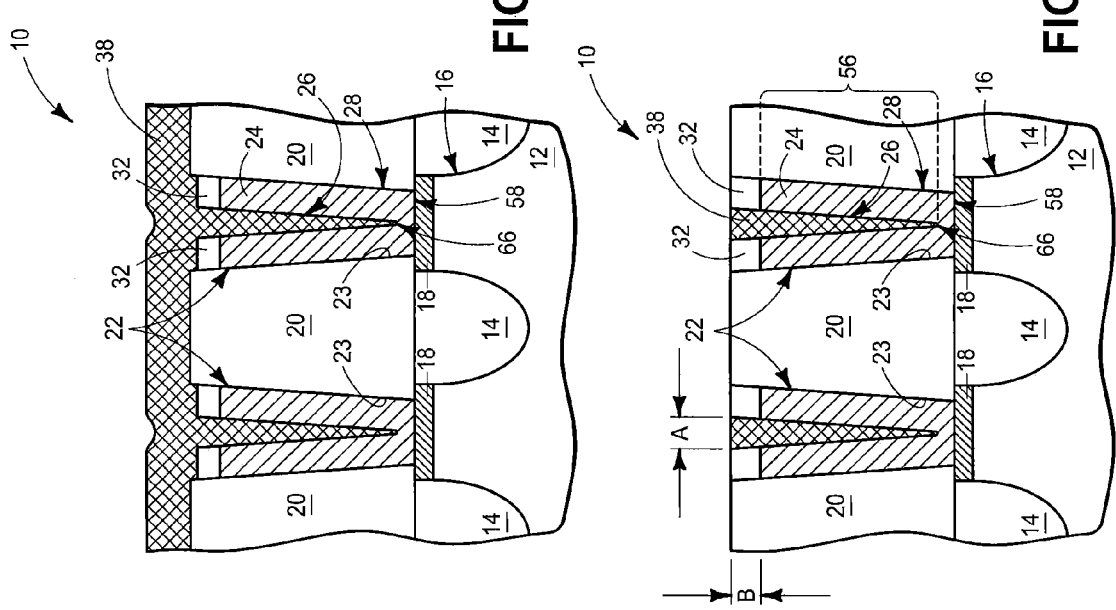
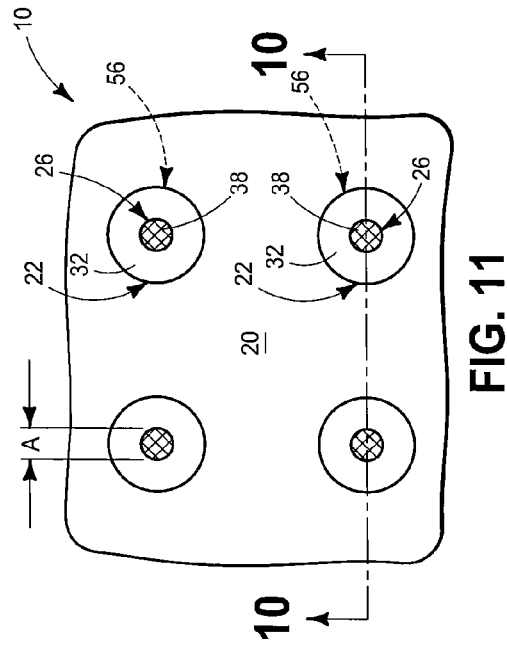
FIG. 11

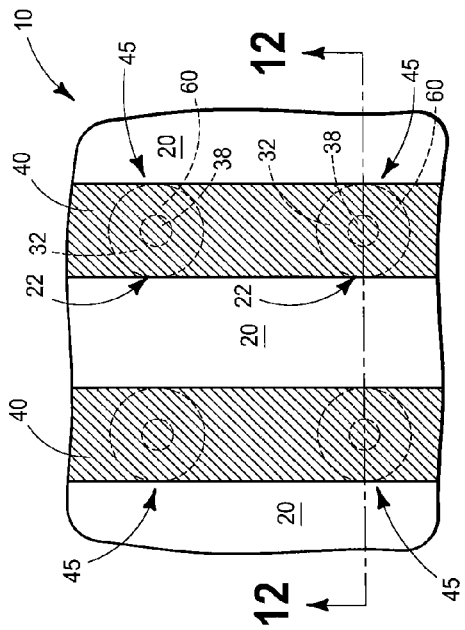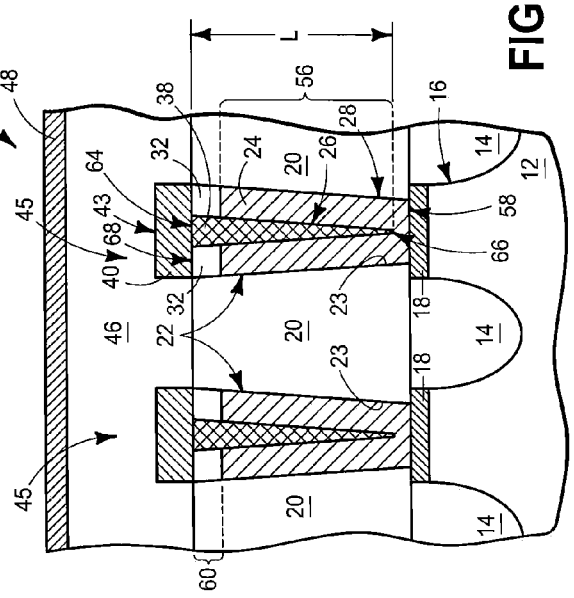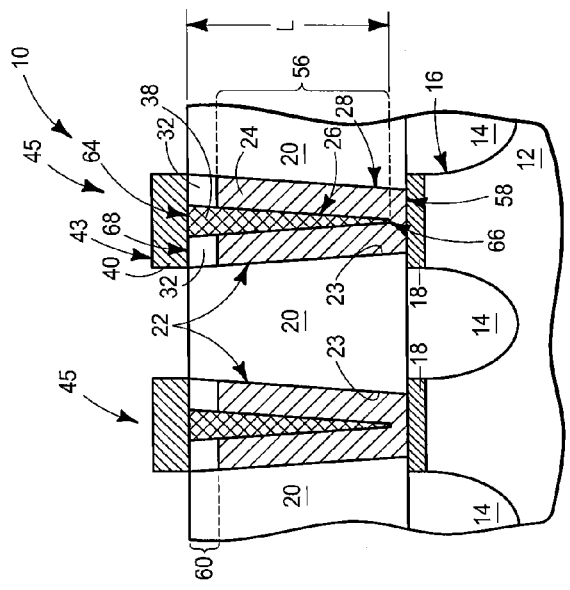

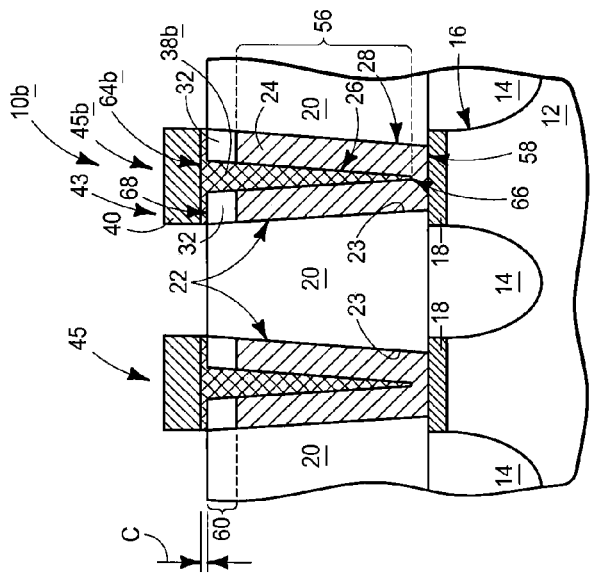
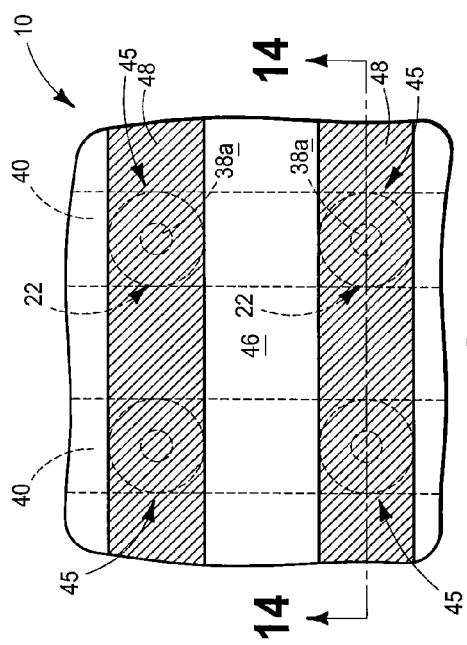
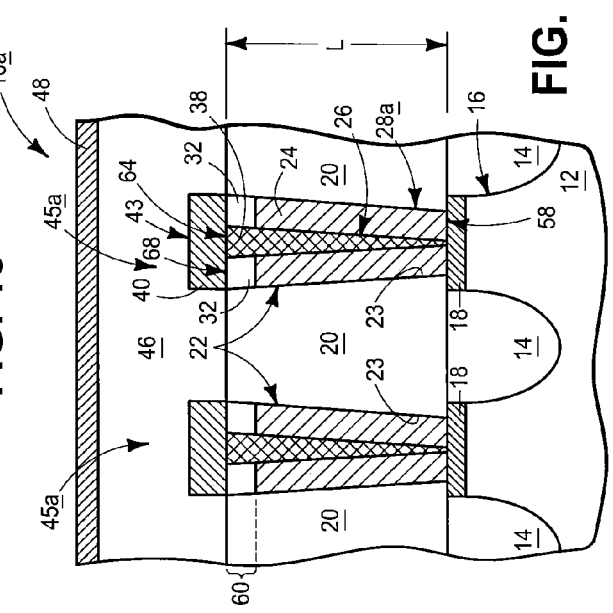

PHASE CHANGE MEMORY CELLS AND METHODS OF FORMING PHASE CHANGE MEMORY CELLS

TECHNICAL FIELD

Embodiments disclosed herein pertain to phase change memory cells and to methods of forming phase change memory cells.

BACKGROUND

Memory is one type of integrated circuitry, and may be used in electronic systems for storing data. Memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information. The stored memory may be non-volatile wherein the memory state is maintained for a considerable period of time and in many instances where power is completely removed from the circuitry. Alternately, the memory may be volatile, requiring to be refreshed (i.e., rewritten), and in many instances multiple times per second.

One type of non-volatile memory is a phase change memory cell. Such memories use a reversibly programmable material that has the property of switching between two different phases, for example between an amorphous, disorderly phase and a crystalline or polycrystalline, orderly phase. The two phases may be associated with resistivities of significantly different values. Presently, typical phase change materials are chalcogenides, although other materials may be developed. With chalcogenides, the resistivity may vary by two or more orders of magnitude when the material passes from the amorphous (more resistive) phase to the crystalline (more conductive) phase, and vice-versa. Phase change can be obtained by locally increasing the temperature of the chalcogenide. Below 150° C., both phases are stable. Starting from an amorphous state and rising to temperature above about 400° C., a rapid nucleation of the crystallites may occur and, if the material is kept at the crystallization temperature for a sufficiently long time, it undergoes a phase change to become crystalline. Reversion to the amorphous state can result by raising the temperature above the melting temperature (about 600° C.) followed by cooling.

In phase change memory, a plurality of memory cells is typically arranged in rows and columns to form an array or sub-array. Each memory cell is coupled to a respective select or access device which may be implemented by any switchable device, such as a PN diode, a bipolar junction transistor, a field effect transistor, etc. The access device is often electrically coupled with, or forms a part of, what is referred to as an access line or word line. A resistive electrode is electrically coupled with the switchable device, and comprises heater material which is configured to heat up upon sufficient current flowing there-through. The phase change material is provided in proximity to the heater material, thereby forming a programmable storage element. The crystallization temperature and the melting temperature are obtained by causing an electric current to flow through the heater material, thus heating the phase change material. An electrode, typically referred to as a bit, digit, or select line, is electrically coupled to the phase change material.

BRIEF DESCRIPTION OF THE DRAWINGS

FIG. 9 is a view of the FIG. 7 substrate fragment at a processing step subsequent to that shown by FIG. 7.

FIG. 10 is a view of the FIG. 9 substrate fragment at a processing step subsequent to that shown by FIG. 9, and is taken through line 10-10 in FIG. 11.

FIG. 11 is a top plan view of the substrate fragment of FIG. 10.

FIG. 12 is a view of the FIG. 10 substrate fragment at a processing step subsequent to that shown by FIG. 10, and is taken through line 12-12 in FIG. 13.

FIG. 13 is a top plan view of the substrate fragment of FIG. 12.

FIG. 14 is a view of the FIG. 12 substrate fragment at a processing step subsequent to that shown by FIG. 12, and is taken through line 14-14 in FIG. 15.

FIG. 15 is a top plan view of the substrate fragment of FIG. 14.

FIG. 16 is a diagrammatic structural cross-section view of a substrate fragment in accordance with an embodiment of the invention.

FIG. 17 is a diagrammatic structural cross-section view of a substrate fragment in accordance with an embodiment of the invention.

DETAILED DESCRIPTION OF EXAMPLE EMBODIMENTS

Example methods of forming a memory cell in accordance with some embodiments of the invention are initially described with reference to FIGS. 1-15. Embodiments of the invention also encompass phase change memory cells independent of method of manufacture.

Figure 1:
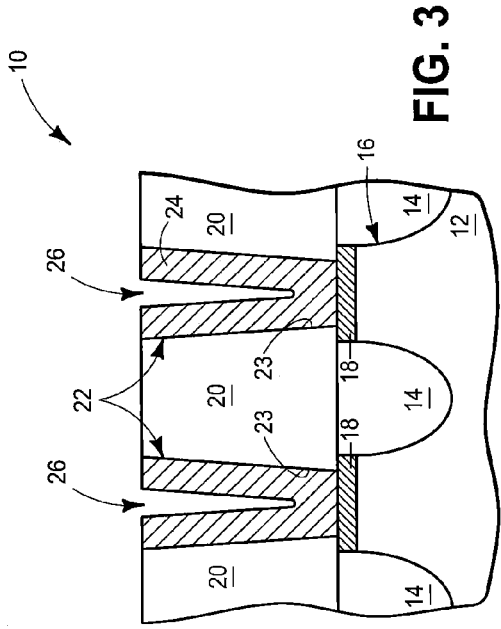
FIG. 1 is a diagrammatic structural cross-section view of a substrate fragment in process in accordance with an embodiment of the invention, and is taken through line 1-1 in FIG. 2.
Figure 2:
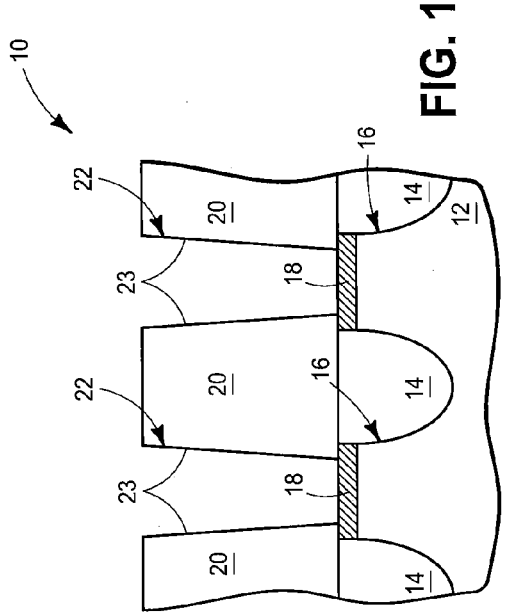
FIG. 2 is a diagrammatic top plan view of the substrate fragment of FIG. 1.

Referring to FIGS. 1 and 2, a substrate fragment 10 comprises a base substrate 12. Substrate 10 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate material 12 may be homogenous or non-homogenous, for example comprising multiple different composition materials and/or layers. As an example, substrate material 12 may comprise bulk-monocrystalline silicon and/or a semiconductor-on-insulator substrate.

Dielectric isolation regions 14 have been formed within substrate material 12 whereby example islands or pillar-like regions 16 comprising semiconductor material 12 have been formed. The dielectric material of regions 14 may be homogenous or non-homogenous, with silicon nitride and doped or undoped silicon dioxide being examples. Highly conductive contact regions 18 have been formed atop or as part of islands 16. Example materials for regions 18 are refractory metal silicides, such as cobalt silicide. Material 12 may comprise suitable type and concentration conductivity enhancing dopant(s) formed in a suitable pattern whereby regions 18 and material 12 in combination comprise at least part of individual select devices for reading, writing, and erasing individual memory cells. Example select devices include buried junction transistors, although other existing or yet-to-be-developed devices may be used, and which are not particularly material to the inventive aspects disclosed herein.

An insulator material (i.e., dielectric material) 20 has been formed as part of substrate 10. Such may be homogenous or non-homogenous, with silicon nitride and doped or undoped silicon dioxide being examples. Openings 22 extend through material 20 to regions 18. For purposes of the continuing discussion, openings 22 may be considered as having sidewalls 23 and in some embodiments openings 22 may be considered as first openings. Sidewalls 23 may be straight and/or curved, and regardless may taper radially inward moving elevationally into substrate 10 as shown. Openings 22 may be of circular or other shape in horizontal cross-section. As examples only, openings 22 may be oval, elliptical, straight and/or curve-sided, and in the form of elongated trenches running into and out of the plane of the page upon which FIG. 1 lies. Further and only as examples, openings 22 may have respective minimum horizontal opening dimensions at the outermost surface of material 20 from about 50 nanometers to about 60 nanometers. The figures for convenience and clarity in the drawings show openings 22 as being of the same size and shape as, and aligned with, the elevationally outermost surfaces of islands 16 and regions 18. Alternate shapes and alignments may be used. Individual phase change memory cells will be fabricated with respect to individual of openings 22 in the fabrication of an array of phase change memory cells. For convenience, the discussion largely proceeds with respect to fabrication of a single phase change memory cell, although thousands or millions of such memory cells will likely be fabricated at the same time.

Figure 3:
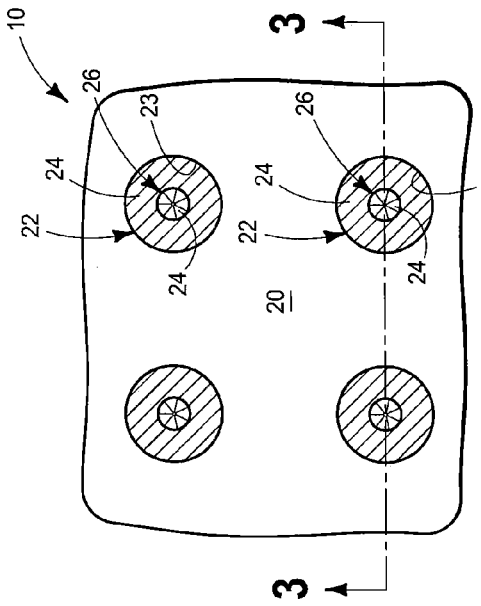
FIG. 3 is a view of the FIG. 1 substrate fragment at a processing step subsequent to that shown by FIG. 1, and is taken through line 3-3 in FIG. 4.
Figure 4:
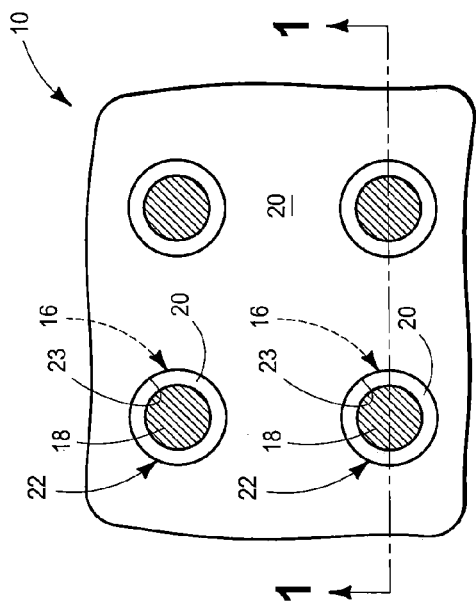
FIG. 4 is a top plan view of the substrate fragment of FIG. 3.

Referring to FIGS. 3 and 4, sidewalls 23 of individual first openings 22 have been lined with conductive (i.e., electrically conductive) material 24 which will comprise an individual first electrode of a phase change memory cell that is being formed. Conductive material 24 may be homogenous or non-homogenous, and may comprise any one or more of an elemental metal, an alloy of two or more elemental metals, a conductive metal compound, and conductively doped semiconductive material. One specific example is elemental tungsten. In one embodiment, conductive material 24 may form a second opening 26 within first opening 22. Regardless, example manners of forming conductive material 24 within opening 22 include one or more of blanket physical vapor deposition, chemical vapor deposition, and atomic layer deposition, followed by polish or etch-back of the deposited conductive material at least to the elevationally outermost surface of insulator material 20. An example thickness for conductive material 24 above insulator material 20, and thereby lateral thickness of conductive material 24 at least proximate the elevationally outermost portion of opening 22, is about 20 nanometers. This leaves an example maximum horizontal opening cross-dimension of opening 26 to be about 15 nanometers for a 55 nanometer opening 22. Other dimensions may of course be used.

Figure 5:
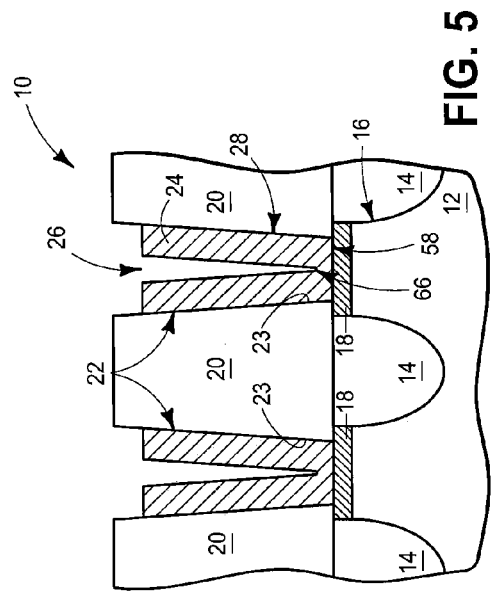
FIG. 5 is a view of the FIG. 3 substrate fragment at a processing step subsequent to that shown by FIG. 3.

Referring to FIG. 5 and in one embodiment, conductive material 24 has been longitudinally recessed within opening 22, forming in one example a first electrode 28 of the memory cell which is being formed. Example techniques of longitudinally recessing include etching conductive material 24, for example by conducting a dry or wet etch. The longitudinal recessing may also remove some of the thickness of conductive material 24 from within second opening 26 over conductive region 18, for example as shown. In such event, the longitudinally recessing may remove sufficient conductive material 24 to expose conductive region 18 (not shown in FIG. 5).

Figure 6:
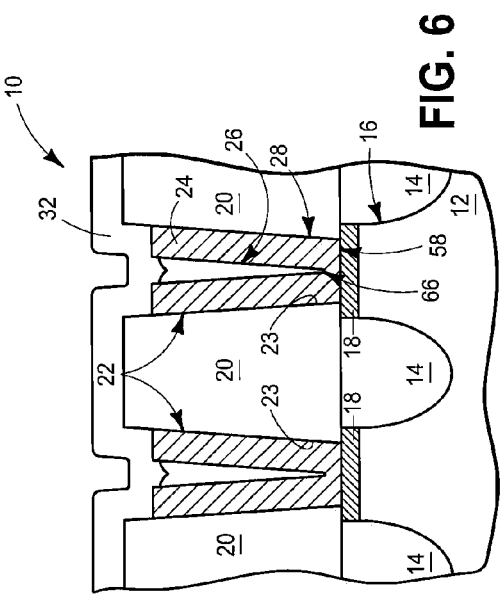
FIG. 6 is a view of the FIG. 5 substrate fragment at a processing step subsequent to that shown by FIG. 5.

Referring to FIG. 6, dielectric material 32 has been deposited to line sidewalls 23 of opening 22 longitudinally outward of recessed conductive material 24. Dielectric material 32 may be homogenous or non-homogenous, with silicon dioxide and silicon nitride being examples. Dielectric material 32 may be deposited to the same thickness as conductive material 34 or to a different thickness. In one embodiment, dielectric material 32 forms a bridge over remaining second opening 26 in conductive material 24, and in one embodiment occludes remaining second opening 26 in conductive material 24. Dielectric material 32 may or may not be received within second opening 26 and, regardless, in one embodiment may leave a void space within the remaining second opening 26 beneath a bridge that is formed. In one embodiment and as shown, dielectric material 32 is deposited to within but does not completely fill remaining volume of second opening 26. Alternately but less ideal, dielectric material 32 may completely fill remaining volume of second opening 26 whereby no void space is formed (not shown). In one embodiment, dielectric material 32 is deposited directly against conductive material 24. In this document, a material or structure is "directly against" another when there is at least some physical touching contact of the stated materials or structures relative one another. In contrast, "over", "on", and "against" not proceeded by "directly", encompass "directly against" as well as constructions where intervening material(s) or structure(s) result(s) in no physical touching contact of the stated materials or structures relative one another.

Figure 7:
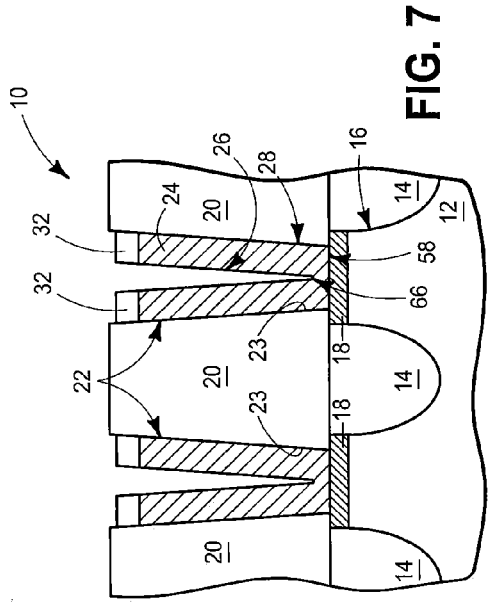
FIG. 7 is a view of the FIG. 6 substrate fragment at a processing step subsequent to that shown by FIG. 6, and is taken through line 7-7 in FIG. 8.
Figure 8:
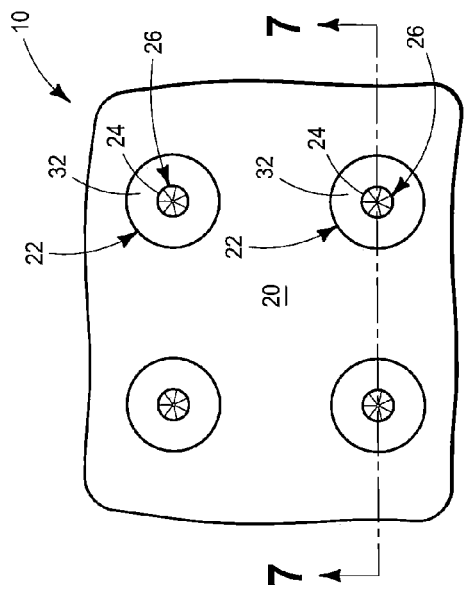
FIG. 8 is a top plan view of the substrate fragment of FIG. 7.

Referring to FIGS. 7 and 8, dielectric material 32 has been removed within opening 22 to uncover remaining second opening 26 and leave dielectric material 32 in first opening 22 longitudinally over recessed conductive material 24. An example removing technique includes dry etching. In one embodiment and as shown, dielectric material 32 is completely removed within first opening 22 from being anywhere received within second opening 26. Alternately, some of dielectric material 32 may remain within second opening 26 (not shown), for example being received in at least a lower portion of remaining second opening 26 when dielectric material 32 was initially there-deposited. FIG. 7 shows removal of dielectric material 32 inward to have an elevationally outermost surface which is elevationally inward from that of insulator material 20. Alternately by way of examples, removal of dielectric material 32 may be inward to be elevationally coincident with the elevationally outermost surface of insulator material 20 or to be elevationally outward thereof.

Referring to FIG. 9, phase change material 38 has been deposited into first opening 22 radially inward of dielectric material 32 and into remaining second opening 26 radially inward of and electrically coupled to conductive material 24 that is within first opening 22. In one embodiment and as shown, phase change material 38 is formed directly against conductive material 24 and directly against dielectric material 32. In one embodiment and as shown, phase change material 38 completely fills remaining volume of second opening 26 in conductive material 24, and in one embodiment as shown completely fills remaining volume of first opening 22 and in one embodiment overfills such remaining volume. Phase change material 38 may be homogenous or non-homogenous. By way of example only, example phase change materials include chalcogenides, such as GeSbTe-based materials. Phase change material 38 may be formed directly against sidewalls 23 of opening 22, for example as shown where dielectric material 32 has been removed elevationally inward sufficiently to expose such sidewalls. Alternately, phase change material 38 may not be formed directly against sidewalls 23 (not shown), for example if the elevationally/longitudinally outermost surface of dielectric material 32 is elevationally coincident with or outward of insulator material 20.

Referring to FIGS. 10 and 11, phase change material 38 has been removed inwardly at least to the elevationally outermost surface of insulator material 20. As shown, phase change material 38 has also been removed elevationally inward at least to the elevationally outermost surface of dielectric material 32, thereby removing some of dielectric material 20. Regardless, example techniques include chemical mechanical polishing and chemical etch-back.

Referring to FIGS. 12 and 13, conductive (i.e., electrically conductive) second electrode material 40 has been formed which electrically couples to phase change material 38. Phase change material 38 and conductive second electrode material 40 may, respectively, be homogenous or non-homogenous. Second electrode material 40 may be of the same or different composition from that of conductive material 24 of first electrode 28. A specific example conductive second electrode material 40 comprises a composite of an elemental copper layer over an elemental tungsten layer over an elemental titanium layer.

FIG. 12 depicts example individual memory cells 45 as comprising respective first electrodes 28 and second electrodes 43 having phase change material 38 there-between (i.e., in series electrical connection between and with electrodes 28 and 43). Second electrodes 43 in the depicted example are shown as being common along a column of memory cells 45, although other constructions may be used. Further, the processing shown by FIGS. 9-13 shows phase change material 38 being removed back at least to material 20 prior to depositing of material 40. Alternately by way of example only, material 40 may be deposited prior to any removal action occurring with respect to phase change material 38.

Referring to FIGS. 14 and 15, dielectric 46 has been formed over memory cells 45, and word or access lines 48 have been formed over dielectric 46. Materials 46 and 48, respectively, may be homogenous or non-homogenous, and may be of the same or different composition from other respective dielectric and conductive materials referred to above. Word or access lines 48 may connect portions of access devices, for example buried junction transistors, along respective rows as-shown. For example, substrate material 12 immediately beneath individual conductive regions 18 may in combination form part of an individual access device for a given memory cell 45. That substrate material 12 may be patterned or formed to be continuous along rows of individual memory cells and access/word lines 48 may be formed thereover. Other constructions may be used.

Method embodiments of the invention include forming a memory cell comprising first and second electrodes having phase change material there-between (i.e., in electrical series connection between and with the first and second electrodes). Some example methods in accordance with the invention include the lining of elevationally or longitudinally inner sidewalls of an opening with conductive material to comprise the first electrode of the memory cell. The opening may be formed within dielectric material. The above described processing through FIG. 3, or through FIGS. 4 and 5, are but examples of lining inner sidewalls of an opening with conductive material to comprise a first electrode of the memory cell.

Elevationally or longitudinally outer sidewalls of the opening are lined with dielectric material. The conductive material may or may not be longitudinally recessed prior to lining the outer sidewalls of the opening with dielectric material. The processing described above with respect to FIGS. 6-8 are but examples of techniques of lining outer sidewalls of the opening with dielectric material.

Phase change material is formed in the opening laterally inward of and electrically coupled to the conductive material in the opening. In one embodiment, the phase change material is also formed in the opening laterally inward of the dielectric material. Regardless, in one embodiment the phase change material is formed to fill a remaining of the volume of the opening laterally inward of the conductive material with the phase change material. The phase change material may be formed to overfill the remaining volume of the opening. Regardless, the phase change material may be formed directly against the conductive material. Any of the attributes described above with respect to the processing through FIG. 11 may be used and constitute but examples of forming phase change material in an opening that is at least laterally inward of and electrically coupled to the conductive material within the opening that comprises the first electrode.

In one embodiment, the conductive material comprises a cylindrical portion received about the phase change material in the opening at the conclusion of forming the phase change material in the opening. In one embodiment, the cylindrical portion completely encircles the phase change material. For example with respect to the construction of FIGS. 10 and 11, conductive material 24 includes a cylindrical portion 56 received about phase change material 38 within opening 22, and which in one embodiment completely encircles phase change material 38. The embodiment of FIGS. 10 and 11 shows example cylindrical portion 56 as tapering elevationally and radially inward. However, other constructions may be used. For example, elevationally outward and/or radially outward tapering (not shown), or non-tapering cylindrical portions (not shown), may be used. Regardless, a "cylindrical portion" as used herein need not be in the form of a circle (i.e., it could be of other polygonal shape), and regardless need not completely encircle material about which such is received.

Some method embodiments of forming a memory cell include partially filling an opening in an insulator material with conductive material to comprise the first electrode of the memory cell, for example regardless of whether some or all of the sidewalls of such an opening is lined with conductive material. Remaining volume of the opening is partially filled with dielectric material over the conductive material, for example regardless of whether outer sidewalls of the opening are lined with the dielectric material. After partially filling the opening with the dielectric material, phase change material is formed in the opening directly against the conductive material in the opening and directly against the dielectric material in the opening. Conductive second electrode material is formed which electrically couples to the phase change material. Any one or combination of more than one of the above attributes may be used.

A method embodiment of the invention includes circumferentially self-aligning phase change material within an opening within the first electrode, and forming conductive second electrode material over and electrically coupled to the phase change material. In the context of this document, "self-aligned" means a technique whereby at least a lateral surface of a structure is defined by deposition of material against a sidewall of a previously patterned structure. In the context of this document, "circumferentially self-aligned" is a self-aligned technique whereby all lateral surfaces of a structure are defined by deposition of material against an encircling sidewall of a previously patterned structure. The above example embodiments described at least through FIG. 10 are examples. The method may reduce a mask step where, for example, a dedicated mask step was used in the prior art for patterning the phase change material.

Embodiments of the invention also encompass phase change memory cells independent of method of fabrication. Yet, such phase change memory cells may have any one or more than one of the attributes described above with respect to method and/or structure. Further, embodiments of the invention encompass methods of fabricating any of the below described phase change memory cells.

Referring to FIGS. 12 and 13, an example phase change memory cell 45 in accordance with one example embodiment of the invention includes a first electrode 28 comprising a cylindrical portion 56. First electrode 28 may be considered as having an elevationally innermost base surface 58. Dielectric material 32 comprises a cylindrical portion 60 that is longitudinally over cylindrical portion 56 of first electrode 28. In one embodiment and as shown, cylindrical portion 60 of dielectric material 32 is directly against cylindrical portion 56 of first electrode 28. Regardless, the embodiment of FIGS. 12 and 13 shows example cylindrical portion 60 as tapering elevationally and radially inward. However, other constructions may be used. For example elevationally outward and/or radially outward tapering (not shown), or non-tapering cylindrical portions (not shown), may be used and regardless of the configuration of cylindrical portion 56 of first electrode 28.

Phase change material 38 is radially inward of and electrically coupled to cylindrical portion 56 of first electrode 28. In one embodiment, phase change material 38 is also radially inward of dielectric material 32. In one embodiment, the phase change material is directly against cylindrical portion 56 of first electrode 28, and in one embodiment is directly against cylindrical portion 60 of dielectric material 32. In one embodiment, cylindrical portion 56 of first electrode 28 encircles phase change material 38 along at least a longitudinal portion of phase change material 38, and in one embodiment along at least a majority of longitudinal length "L" (FIG. 12) of phase change material 38. In one embodiment, phase change material 38 completely fills a radially inward void space defined by cylindrical portion 56 of first electrode 28.

Phase change material 38 may be considered as having an elevationally outermost surface 64 and an elevationally innermost surface 66. Cylindrical portion 60 of dielectric material 32 may be considered as having an elevationally outermost surface 68. In one embodiment, surface 68 is elevationally coincident with surface 64, for example as shown. In one embodiment, phase change material 38 is everywhere elevationally outward of first electrode base surface 58. In one embodiment, elevationally outermost surface 64 of phase change material 38 is wider than its elevationally innermost surface 66. In one embodiment, first electrode 28 and dielectric material 32 in combination are generally V-shaped in vertical cross-section, for example as shown. In one embodiment, phase change material 38 fills the general V-shape.

A second electrode is over and electrically coupled to phase change material 38. In one embodiment, second electrode 43 is directly against phase change material 38. In one embodiment, second electrode 43 is directly against the phase change material at an elevationally outermost contact surface (e.g., surface 64) that is smaller than elevationally innermost base surface 58 of first electrode 28. In one embodiment, the first electrode, the second electrode, and the phase change material define an electrical current path of position-dependent cross section, with the electrical current path being of smallest cross section as defined by shape and position of the phase change material. In one embodiment, a cross section of the phase change material at an elevation corresponding to the cylindrical portion of the dielectric material is a smallest cross section of an electrical current path between the first electrode and the second electrode.

Any other one or more than one of the attributes as described above with the method embodiments may be incorporated in the structure embodiments of the invention. Analogously, any of the structural aspects may be incorporated in the above methodical aspects.

The embodiments depicted in FIGS. 12-15 show phase change material 38 being everywhere elevationally outward of first electrode base surface 58. FIG. 16 shows an alternate example memory cell 45a. Like numerals from the above described embodiments have been used where appropriate, with some construction differences being indicated with the suffix "a". Phase change material 38a in memory cell 45a extends elevationally inward at least to base surface 58 of first electrode 28a.

The embodiments depicted in FIGS. 12-16 show elevationally outermost surface 64 of phase change material 38 being elevationally coincident with elevationally outermost surface 68 of dielectric material 32. FIG. 17 shows and alternate example substrate fragment 10b having a memory cell 45b. Like numerals from the above described embodiments have been used where appropriate, with some construction differences being indicated with the suffix "b". Phase change material 38b in memory cell 45b extends elevationally outward over surface 68 of dielectric material 32 to have an elevationally higher outermost surface 64b. As an alternate example, phase change material 38 may extend elevationally outward higher than surface 68 but not elevationally over dielectric material 32 (not shown), and with any gap (not shown) formed between dielectric 32 and second electrode material 40 being ultimately filled with dielectric in one example. Regardless, an example dimension "C" is less than or equal to about 30 nanometers.

The embodiments depicted in FIGS. 12-16 also show second electrode 43 being directly against phase change material 38 at an elevationally outermost contact surface 64 that is smaller than elevationally innermost base surface 58 of first electrode 28. The embodiment of FIG. 17 alternately shows second electrode 43 being directly against phase change material 38b at an elevationally outermost contact surface 64b that is larger than elevationally innermost base surface 58 of first electrode 28. Further, the embodiments depicted in FIGS. 12-16 also show elevationally outermost surface 64 of phase change material 38 being smaller than elevationally innermost base surface 58 of first electrode 28. The embodiment of FIG. 17 alternately shows elevationally outermost surface 64b of phase change material 38b being larger than elevationally innermost base surface 58 of first electrode 28. To implement the embodiment of FIG. 17, the phase change material may not be etched back after its deposition (i.e., immediately after FIG. 9), and regardless it may be defined in the same masking step(s) in which second electrodes 43 are defined.

In one aspect, at least some embodiments of the invention may enable memory cells comprising first and second electrodes having phase change material there-between that do not have separate dedicated heater material that is part of either of the first and second electrodes, and that does not have a separate dedicated heater material between either of the first and second electrodes and phase change material. Accordingly in one embodiment, a method in accordance with the invention may be devoid of forming heater material as part of either of the first and second electrodes and being devoid of forming heater material between either of the first and second electrodes and the phase change material. Further in one embodiment, a phase change memory cell independent of method of manufacture comprises first and second electrodes having phase change material there-between which is devoid of heater material as part of either of the first and second electrodes and is devoid of heater material between either of the first and second electrodes and the phase change material. For example in one ideal embodiment, a sufficiently small contact area between the second electrode and the phase change material in combination with a sufficiently small thickness of dielectric material 32 may enable sufficient heat generation within phase change material 38 above first electrode 24 and below second electrode 43 to enable repeated program between the different programmed states. With reference to FIGS. 10 and 11, in one embodiment dimension A is less than or equal to about 25 nanometers, and in one embodiment is less than or equal to about 15 nanometers (i.e., assuming area total derived from a substantial circular contact surface 64 of about 700 and 2,000 square nanometers, respectively). In one embodiment, A is from about 10 nanometers to about 25 nanometers (i.e., contact area from about 314 to 2,000 square nanometers), and B is from about 10 nanometers to about 50 nanometers. In one embodiment, a first contact area between the phase change material and one of the first and second electrodes is no greater than about 2,000 square nanometers, and a second contact area between the phase change material and the other of the first and second electrodes is at least ten times greater than the first contact area. In one embodiment, the active volume of phase change material may be small (e.g., essentially being limited to the region surrounded by dielectric material 32).

CONCLUSION

In some embodiments, a method of forming a memory cell comprising first and second electrodes having phase change material there-between comprises lining elevationally inner sidewalls of an opening with conductive material to comprise the first electrode of the memory cell. Elevationally outer sidewalls of the opening are lined with dielectric material. Phase change material is formed in the opening laterally inward of and electrically coupled to the conductive material in the opening. Conductive second electrode material is formed that is electrically coupled to the phase change material.

In some embodiments, a method of forming a memory cell comprising first and second electrodes having phase change material there-between comprises partially filling an opening in an insulator material with conductive material to comprise the first electrode of the memory cell. Remaining volume of the opening is partially filled with dielectric material over the conductive material. After the partially filling with the dielectric material, phase change material is formed in the opening directly against the conductive material in the opening and directly against the dielectric material in the opening. Conductive second electrode material is formed that is electrically coupled to the phase change material.

In some embodiments, a method of forming a memory cell comprising first and second electrodes having phase change material there-between comprises lining sidewalls of a first opening in insulator material with conductive material to comprise the first electrode of the memory cell. The conductive material forms a second opening within the first opening. The conductive material is longitudinally recessed within the first opening. Dielectric material is deposited to line sidewalls of the first opening longitudinally outward of the recessed conductive material and to occlude remaining of the second opening in the recessed conductive material. The dielectric material in the first opening is removed to uncover remaining of the second opening and leave the dielectric material in the first opening longitudinally over the recessed conductive material. After removing the dielectric material, phase change material is deposited into the first opening radially inward of the dielectric material and into remaining of the second opening radially inward of and electrically coupled to the conductive material in the first opening. Conductive second electrode material is formed that is electrically coupled to the phase change material.

In some embodiments, a method of forming a memory cell comprising first and second electrodes having phase change material there-between comprises circumferentially self-aligning the phase change material within an opening within the first electrode. Conductive second electrode material is formed that is electrically coupled to the phase change material.

In some embodiments, a phase change memory cell comprises first and second electrodes having phase change material there-between. The phase change memory cell is devoid of heater material as part of either of the first and second electrodes and is devoid of heater material between either of the first and second electrodes and the phase change material.

In some embodiments, a phase change memory cell comprises a first electrode comprising a cylindrical portion. Dielectric material comprising a cylindrical portion is longitudinally over the cylindrical portion of the first electrode. Phase change material is radially inward of and electrically coupled to the cylindrical portion of the first electrode. A second electrode is electrically coupled to the phase change material.

In some embodiments, a phase change memory cell comprises a first electrode comprising a cylindrical portion. Dielectric material comprising a cylindrical portion longitudinally is over and directly against the cylindrical portion of the first electrode. Phase change material is directly against the cylindrical portions of the first electrode and the dielectric material radially inward of the cylindrical portions of the first electrode and the dielectric material. A second electrode is electrically coupled to the phase change material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a memory cell comprising first and second electrodes having phase change material there-between, the method comprising:
   depositing conductive material to line elevationally inner sidewalls of an opening in insulator material to comprise the first electrode of the memory cell, the conductive material less than filling the opening in the insulator material and comprising an opening in the conductive material;
   lining elevationally outer sidewalls of the opening in the insulator material with dielectric material, the dielectric material that lines the elevationally outer sidewalls of the opening in the insulator material not being within the opening in the conductive material in a finished construction of the memory cell, the dielectric material that lines the elevationally outer sidewalls of the opening including a portion that is elevationally outward of the conductive material of the first electrode in the finished circuitry construction;
   after forming the dielectric material that lines the elevationally outer sidewalls of the opening in the insulator material, forming phase change material in the opening in the conductive material laterally inward of and electrically coupled to the conductive material; and
   after forming the phase change material, forming conductive material of the second electrode elevationally outward of and electrically coupled to the phase change material.

2. The method of claim 1 being devoid of forming heater material as part of either of the first and second electrodes and being devoid of forming heater material between either of the first and second electrodes and the phase change material.

3. The method of claim 1 wherein the phase change material has a total elevational thickness within the opening in the insulator material, the conductive material comprising a cylindrical portion at least partially encircling a perimeter of a portion of the total elevational thickness of the phase change material in the opening in the insulator material at the conclusion of forming the phase change material in the opening in the insulator material.

4. The method of claim 3 wherein the cylindrical portion completely encircles the perimeter of the portion of the phase change material.

5. The method of claim 1 wherein forming the phase change material comprises completely filling a remaining volume of the opening in the insulator material laterally inward of the conductive material with the phase change material.

6. A method of forming a memory cell comprising first and second electrodes having phase change material there-between, the method comprising:
   lining elevationally inner sidewalls of an opening in insulator material with conductive material to comprise the first electrode of the memory cell, the conductive material comprising an opening therein;
   lining elevationally outer sidewalls of the opening in the insulator material with dielectric material, the dielectric material that lines the elevationally outer sidewalls of the opening in the insulator material not being within the opening in the conductive material in a finished construction of the memory cell;
   after lining elevationally outer sidewalls of the opening in the insulator material with dielectric material, forming phase change material in the opening in the conductive material laterally inward of and electrically coupled to the conductive material;
   forming conductive second electrode material electrically coupled to the phase change material; and
   etching into all elevationally outermost surfaces of the conductive material within the opening in the insulator material to longitudinally recess the conductive material within the opening in the insulator material prior to lining the outer sidewalls of the opening with dielectric material.

7. A method of forming a memory cell comprising first and second electrodes having phase change material there-between, the method comprising:
   partially filling an opening in an insulator material with conductive material to comprise the first electrode of the memory cell;
   partially filling remaining volume of the opening in the insulator material with dielectric material over the conductive material;
   after the partially filling with the dielectric material, forming phase change material in the opening in the insulator material directly against the conductive material in the opening in the insulator material and directly against the dielectric material in the opening in the insulator material;
   forming conductive second electrode material electrically coupled to the phase change material; and
   the partially filling with the conductive material forming an opening in the conductive material, the partially filling with the dielectric material forming a bridge over the opening in the conductive material, the bridge both occluding the opening in the conductive material and leaving a void space comprising the opening in the conductive material elevationally inward of the bridge.

8. The method of claim 7 wherein forming phase change material comprises removing the bridge and depositing the phase change material into the void space.

9. A method of forming a memory cell comprising first and second electrodes having phase change material there-between, the method comprising:
   lining sidewalls of a first opening in insulator material with conductive material to comprise the first electrode of the memory cell, the conductive material forming a second opening within the first opening;
   longitudinally recessing the conductive material within the first opening;
   depositing dielectric material to line sidewalls of the first opening longitudinally outward of the recessed conductive material and to occlude and at least partially fill remaining of the second opening in the recessed conductive material with the dielectric material;
   removing the dielectric material in the first opening to uncover remaining of the second opening and leave the dielectric material in the first opening longitudinally over the recessed conductive material but not laterally over sidewalls of the conductive material that is in the first opening;
   after removing the dielectric material, depositing phase change material into the first opening radially inward of the dielectric material and into remaining of the second opening radially inward of and electrically coupled to the conductive material in the first opening; and
   forming conductive second electrode material electrically coupled to the phase change material.

10. The method of claim 9 wherein the conductive second electrode material is never formed into the first opening.

11. A method of forming a memory cell comprising first and second electrodes having phase change material there-between, the method comprising:

partially filling a previously formed opening in an insulator material with conductive material to comprise the first electrode of the memory cell, the first electrode comprising a cylindrical portion, the first electrode having an elevationally innermost base surface;

partially filling remaining volume of the previously formed opening with dielectric material over the conductive material;

after the partially filling with the dielectric material, forming phase change material within radially internal void space of and directly against the cylindrical portion of the first electrode and directly against the dielectric material in the opening, the phase change material extending elevationally inward at least to the elevationally innermost base surface of the first electrode; and forming conductive second electrode material electrically coupled to the phase change material.

* * * * *